(12) United States Patent
Van Buel et al.

(10) Patent No.: US 8,395,772 B2
(45) Date of Patent: Mar. 12, 2013

(54) SENSOR, A TABLE AND LITHOGRAPHIC APPARATUS

(75) Inventors: Henricus Wilhelmus Maria Van Buel, 's-Hertogenbosch (NL); Jeroen Thomas Broekhuijse, Overpelt (BE); Vitaliy Prosyentsov, Deume (NL); Sandra Van Der Graaf, 's-Hertogenbosch (NL); Nina Vladimirovna Dziomkina, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 379 days.

(21) Appl. No.: 12/818,358

(22) Filed: Jun. 18, 2010

(65) Prior Publication Data

US 2010/0321695 A1 Dec. 23, 2010

Related U.S. Application Data

(60) Provisional application No. 61/249,346, filed on Oct. 7, 2009, provisional application No. 61/218,712, filed on Jun. 19, 2009.

(51) Int. Cl.
*G01N 21/00* (2006.01)

(52) U.S. Cl. .................. 356/432; 356/437; 356/246

(58) Field of Classification Search .......... 356/432–444, 356/246; 250/227.2, 353; 359/738, 739, 359/483

See application file for complete search history.

(56) References Cited

U.S. PATENT DOCUMENTS

| | | | |
|---|---|---|---|
| 4,509,852 A | 4/1985 | Tabarelli et al. | |
| 5,101,285 A * | 3/1992 | Kawai et al. | 358/471 |
| 5,291,471 A * | 3/1994 | Russell | 369/109.02 |
| 5,866,935 A * | 2/1999 | Sogard | 257/435 |
| 7,508,698 B2 | 3/2009 | Houston | |
| 8,208,123 B2 * | 6/2012 | Loopstra et al. | 355/67 |
| 2004/0121248 A1 * | 6/2004 | Eynon | 430/5 |
| 2004/0136494 A1 | 7/2004 | Lof et al. | |
| 2004/0207824 A1 | 10/2004 | Lof et al. | |
| 2006/0038968 A1 | 2/2006 | Kemper et al. | |
| 2006/0119809 A1 | 6/2006 | Verhagen et al. | |
| 2006/0158627 A1 | 7/2006 | Kemper et al. | |
| 2007/0115450 A1 | 5/2007 | Nagasaka et al. | |
| 2008/0164415 A1 * | 7/2008 | Kierse et al. | 250/353 |
| 2008/0212046 A1 | 9/2008 | Riepen et al. | |
| 2009/0032688 A1 * | 2/2009 | Lapstun | 250/227.2 |

(Continued)

FOREIGN PATENT DOCUMENTS

| | | |
|---|---|---|
| EP | 1 420 298 A2 | 5/2004 |
| EP | 1 420 300 A2 | 5/2004 |

(Continued)

OTHER PUBLICATIONS

European Search Report dated Sep. 15, 2010 for corresponding European patent application No. EP 10162908.7.

(Continued)

*Primary Examiner* — Sang Nguyen

(74) *Attorney, Agent, or Firm* — Pillsbury Winthrop Shaw Pittman LLP

(57) ABSTRACT

A sensor for an immersion system is disclosed. The sensor comprises: a sensing device, a transparent layer and an opaque patterning layer. The sensing device is configured to sense a property of a beam of radiation. The transparent layer is configured to allow the passage of a beam of radiation therethrough. The transparent layer covers the sensing device. The opaque patterning layer is configured to impart a pattern to the beam of radiation. In the patterning layer is an opening in which is located an infilling material. The infilling material is transparent to the beam of radiation and has a similar refractive index to that of the transparent layer.

20 Claims, 7 Drawing Sheets

U.S. PATENT DOCUMENTS

| | | |
|---|---|---|
| 2009/0053105 A1* | 2/2009 | Hosoya et al. ............... 422/68.1 |
| 2009/0279060 A1 | 11/2009 | Direcks et al. |
| 2009/0279062 A1 | 11/2009 | Direcks |
| 2010/0060868 A1 | 3/2010 | Tanasa et al. |

FOREIGN PATENT DOCUMENTS

| | | |
|---|---|---|
| JP | 10-198023 | 7/1998 |
| JP | 10-229043 | 8/1998 |
| JP | 2005-268744 | 9/2005 |
| JP | 2005-351990 | 12/2005 |
| JP | 2007-059522 | 3/2007 |
| JP | 2008-153554 | 7/2008 |
| WO | 99/49504 A1 | 9/1999 |
| WO | 2004/059710 | 7/2004 |
| WO | 2005/064405 A2 | 7/2005 |
| WO | 2005/119368 | 12/2005 |

OTHER PUBLICATIONS

Japanese Office Action mailed Aug. 28, 2012 in corresponding Japanese Patent Application No. 2010-135725.

Japanese Office Action mailed Feb. 7, 2012 in corresponding Japanese Patent Application No. 2010-135725.

* cited by examiner

SENSOR, A TABLE AND LITHOGRAPHIC APPARATUS

This application claims priority and benefit under 35 U.S.C. §119(e) to U.S. Provisional Patent Application No. 61/218,712, entitled "A Sensor, A Table and Lithographic Apparatus", filed on Jun. 19, 2009 and to U.S. Provisional Patent Application No. 61/249,346, entitled "A Sensor, A Table and Lithographic Apparatus", filed on Oct. 7, 2009. The content of each of the foregoing applications is incorporated herein in its entirety by reference.

FIELD

The present invention relates to a sensor for an immersion system apparatus, a table comprising the sensor and a lithographic apparatus comprising the sensor.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. The liquid is desirably distilled water, although another liquid can be used. An embodiment of the invention will be described with reference to liquid. However, another fluid may be suitable, particularly a wetting fluid, an incompressible fluid and/or a fluid with higher refractive index than air, desirably a higher refractive index than water. Fluids excluding gases are particularly desired. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable are a hydrocarbon, such as an aromatic, a fluorohydrocarbon, or an aqueous solution.

Submersing the substrate or substrate and substrate table in a bath of liquid (see, for example, U.S. Pat. No. 4,509,852) means that there is a large body of liquid that must be accelerated during a scanning exposure. This requires additional or more powerful motors and turbulence in the liquid may lead to undesirable and unpredictable effects.

Another arrangement proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT patent application publication no. WO 99/49504. This type of arrangement may be referred to as a localized immersion system.

Another arrangement is an all wet arrangement in which the immersion liquid is unconfined as disclosed in PCT patent application publication no. WO2005/064405. In such a system the immersion liquid is unconfined. The whole top surface of the substrate is covered in liquid. This may be advantageous because then the whole top surface of the substrate is exposed to the substantially same conditions. This may have an advantage for temperature control and processing of the substrate. In WO 2005/064405, a liquid supply system provides liquid to the gap between the final element of the projection system and the substrate. That liquid is allowed to leak (or flow) over the remainder of the substrate. A barrier at the edge of a substrate table prevents the liquid from escaping so that it can be removed from the top surface of the substrate table in a controlled way. Although such a system improves temperature control and processing of the substrate, evaporation of the immersion liquid may still occur. One way of helping to alleviate that problem is described in United States patent application publication no. US 2006/0119809. A member is provided which covers the substrate in all positions and which is arranged to have immersion liquid extending between it and the top surface of the substrate and/or substrate table which holds the substrate.

In European patent application no. EP-A-1,420,300 and US patent application publication no. US 2004-0136494, each hereby incorporated in their entirety by reference, the idea of a twin or dual stage immersion lithography apparatus is disclosed. Such an apparatus is provided with two stages for supporting the substrate. Leveling measurements are carried out with a stage at a first position, without immersion liquid, and exposure is carried out with a stage at a second position, where immersion liquid is present. Alternatively, the apparatus has only one stage.

After exposure of a substrate in an immersion lithographic apparatus, the substrate table is moved away from its exposure position to a position in which the substrate may be removed and replaced by a different substrate. This is known as substrate swap. In a two stage lithographic apparatus, the swap of the tables may take place under the projection system.

In an immersion apparatus, immersion liquid is handled by a fluid handling system or apparatus. A fluid handling system may supply immersion fluid and therefore be a fluid supply system. A fluid handling system may at least partly confine fluid and thereby be a fluid confinement system. A fluid handling system may provide a barrier to fluid and thereby be a barrier member. Such a barrier member may be a fluid confinement structure. A fluid handling system may create or use a flow of fluid (such as gas), for example to help in handling liquid, e.g. in controlling the flow and/or the position of the immersion fluid. The flow of gas may form a seal to confine the immersion fluid so the fluid handling structure may be referred to as a seal member; such a seal member may be a fluid confinement structure. Immersion liquid may be used as the immersion fluid. In that case, the fluid handling system may be a liquid handling system. The fluid handling system may be located between the projection system and the substrate table. In reference to the aforementioned description, reference in this paragraph to a feature defined with respect to fluid may be understood to include a feature defined with respect to liquid.

In an immersion lithographic apparatus, the immersion liquid may come into contact with a sensor present in an immersion system, for example a sensor on a table such as a substrate table. The sensor may be an optical sensor, for example to measure an optical property of an exposure beam.

FIG. 16 illustrates a sensor disclosed in United States patent application publication no. US 2007-0115450. A liquid repellant layer 501 is positioned above a light shielding material 502, such as chromium. An opening 503 is formed in the light shielding material 502 to allow radiation to pass through. A quartz glass plate 504 with an integrated optical element 505 focuses radiation onto the optical sensor 506. As illustrated, a gap exists between the optical element 505 and the sensor 506.

SUMMARY

To protect the components of the sensor, the sensor may be coated with a protective coating. The protective coating may deteriorate in the presence of: immersion liquid, such as water, e.g. ultra pure water, which may be highly corrosive; radiation of the exposure beam; or a combination of both. Alternatively or additionally a small defect or opening in the protective coating may allow immersion liquid to propagate between the protective coating and sensor. Thus, the components of the sensor beneath the coating, such as a metal mask, may degrade, for example corrode or be etched away by, for example, immersion liquid after, for example, a part of the coating is removed or after immersion liquid has propagated between the protective coating and sensor. The deterioration of the coating and the degradation of a component of the sensor may be a source of contaminating particles in the immersion system. The accuracy of the sensor may deteriorate. The lifetime of the sensor may be shortened, requiring the sensor to be frequently replaced. For these reasons the uptime of the immersion lithographic apparatus may be reduced, the effective throughput may be reduced and/or the cost of ownership increased.

It is desirable, for example, to provide a sensor that is resistant to immersion liquid, or exposure radiation, or both.

It is desirable, for example, to provide a sensor with a substantially flat surface, to help to prevent droplets and bubbles as immersion liquid is provided by the fluid handling system to the sensor.

According to an aspect, there is provided a sensor for an immersion system, the sensor comprising: a sensing device configured to sense a property of a beam of radiation; a transparent layer configured to allow the passage of the beam of radiation therethrough, the transparent layer covering the sensing device; and an opaque patterning layer located between the transparent layer and the sensing device, the patterning layer configured to impart a pattern to the beam of radiation wherein in the patterning layer is an opening in which is located an infilling material that is transparent to the beam of radiation and has a similar refractive index to that of the transparent layer.

According to an aspect, there is provided a sensing component for an immersion system, the sensing component comprising:

a transparent layer configured to allow the passage of a beam of radiation therethrough; and a patterning layer configured to impart a pattern to the beam of radiation and covered by the transparent layer, wherein in the patterning layer is an opening in which is located an infilling material that is transparent to the beam of radiation and has a similar refractive index to that of the transparent layer.

According to an aspect, there is provided a sensor for an immersion system comprising:

a sensing device configured to sense a property of a beam of radiation;

a transparent layer configured to allow the passage of a beam of radiation therethrough; and a patterning layer located between the transparent layer and the sensing device, the patterning layer being configured to impart a pattern to the beam of radiation;

wherein the transparent layer has a surface directed away from the sensing device and the surface is substantially planar and a lyophobic coating is on the surface.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
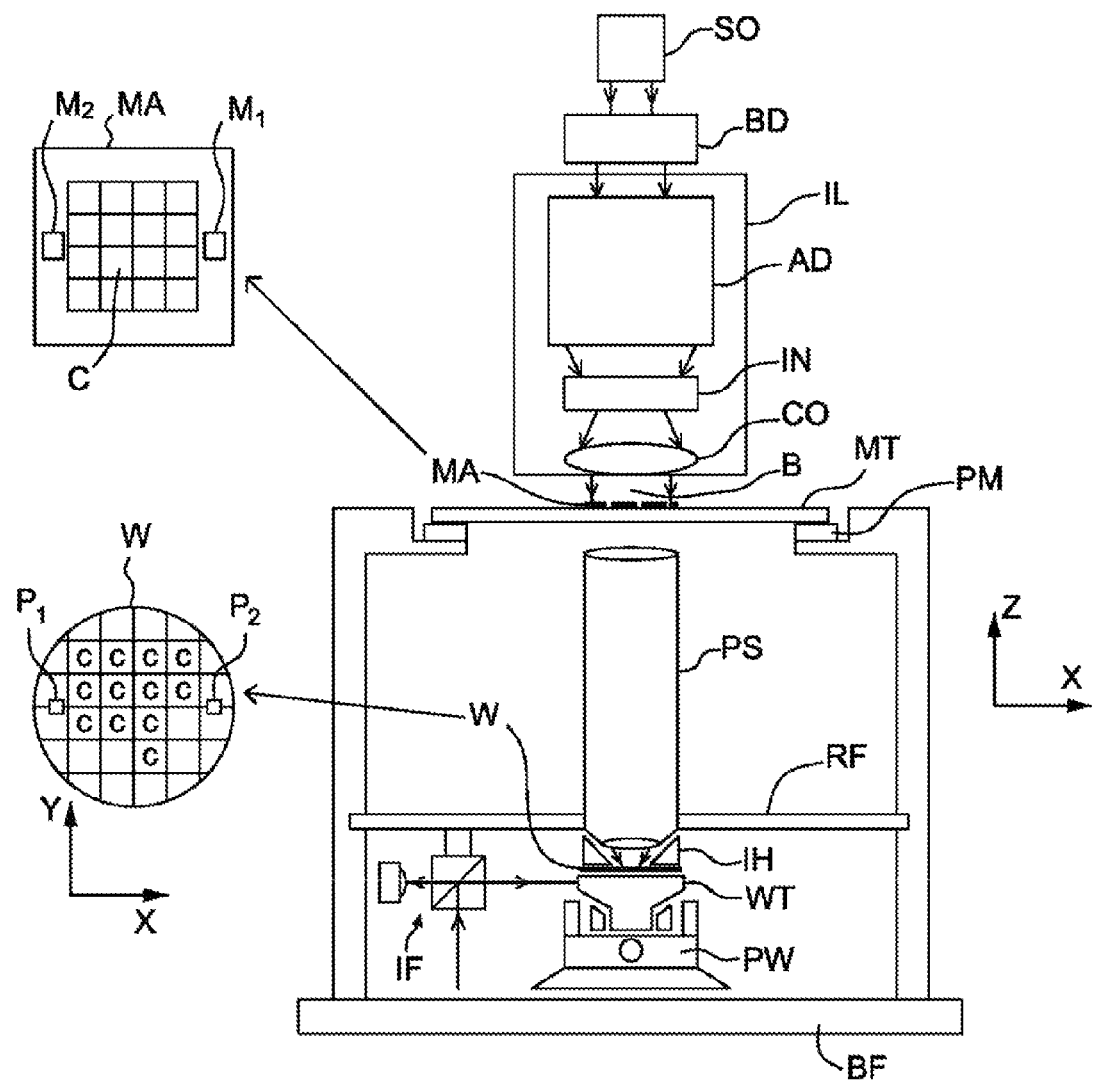
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or DUV radiation).

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Arrangements for providing liquid between a final element of the projection system PS and the substrate can be classed into three general categories. These are the bath type arrangement, the so-called localized immersion system and the all-wet immersion system. In the bath type arrangement substantially the whole of the substrate W and optionally part of the substrate table WT is submersed in a bath of liquid.

The localized immersion system uses a liquid supply system in which liquid is only provided to a localized area of the substrate. The space filled by liquid is smaller in plan than the top surface of the substrate and the area filled with liquid remains substantially stationary relative to the projection system PS while the substrate W moves underneath that area. FIGS. 2-5 show different supply devices which can be used in such a system. A sealing feature is present to seal liquid to the localized area. One way which has been proposed to arrange for this is disclosed in PCT patent application publication no. WO 99/49504.

In the all wet arrangement the liquid is unconfined. The whole top surface of the substrate and all or part of the substrate table is covered in immersion liquid. The depth of the liquid covering at least the substrate is small. The liquid may be a film, such as a thin film, of liquid on the substrate. Immersion liquid may be supplied to or in the region of a projection system and a facing surface facing the projection system (such a facing surface may be the surface of a substrate and/or a substrate table). Any of the liquid supply devices of FIGS. 2-5 can also be used in such a system. However, a sealing feature is not present, not activated, not as efficient as normal or otherwise ineffective to seal liquid to only the localized area.

Figure 2:
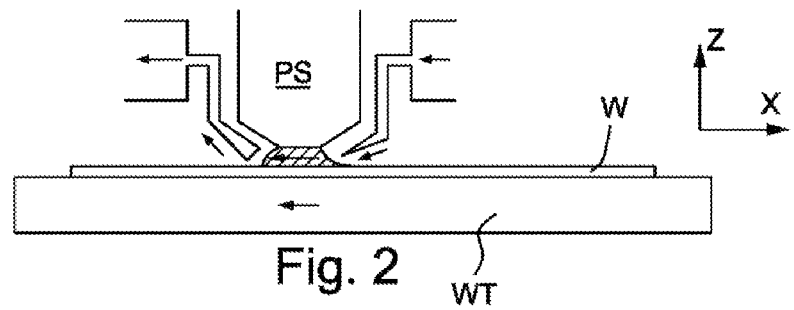
FIGS. 2 and 3 depict a liquid supply system for use in a lithographic projection apparatus.
Figure 3:
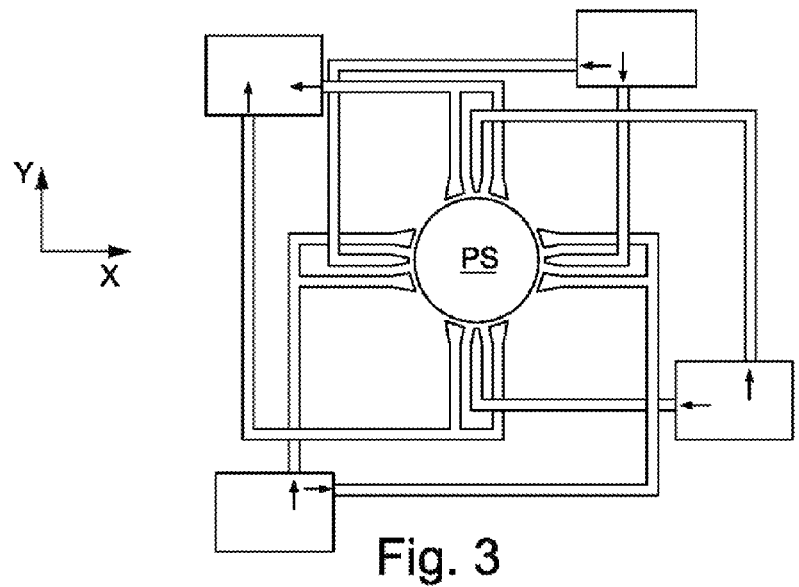

As illustrated in FIGS. 2 and 3, liquid is supplied by at least one inlet onto the substrate, preferably along the direction of movement of the substrate relative to the final element. Liquid is removed by at least one outlet after having passed under the projection system. That is, as the substrate is scanned beneath the element in a −X direction, liquid is supplied at the +X side of the element and taken up at the −X side. FIG. 2 shows the arrangement schematically in which liquid is supplied via inlet and is taken up on the other side of the element by outlet which is connected to a low pressure source. In the illustration of FIG. 2 the liquid is supplied along the direction of movement of the substrate relative to the final element, though this does not need to be the case. Various orientations and numbers of in- and out-lets positioned around the final element are possible; one example is illustrated in FIG. 3 in which four sets of an inlet with an outlet on either side are provided in a regular pattern around the final element. Note that the direction of flow of the liquid is shown by arrows in FIGS. 2 and 3.

Figure 4:
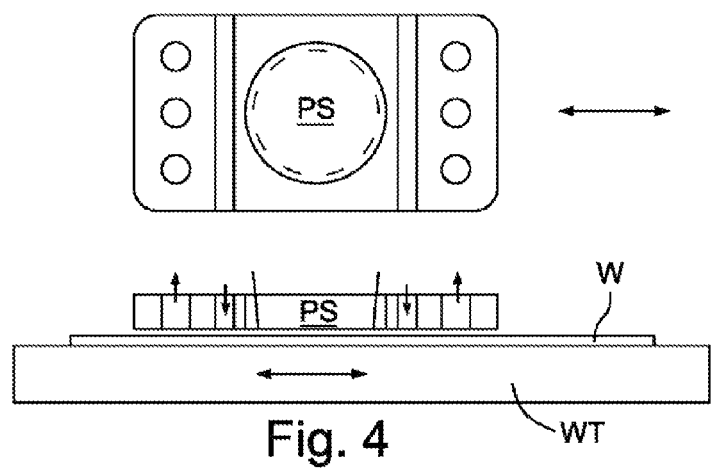
FIG. 4 depicts a further liquid supply system for use in a lithographic projection apparatus.

A further immersion lithography solution with a localized liquid supply system is shown in FIG. 4. Liquid is supplied by two groove inlets on either side of the projection system PS and is removed by a plurality of discrete outlets arranged radially outwardly of the inlets. The inlets can be arranged in a plate with a hole in its centre and through which the projection beam is projected. Liquid is supplied by one groove inlet on one side of the projection system PS and removed by a plurality of discrete outlets on the other side of the projection system PS, causing a flow of a thin film of liquid between the projection system PS and the substrate W. The choice of which combination of inlet and outlets to use can depend on the direction of movement of the substrate W (the other combination of inlet and outlets being inactive). Note that the direction of flow of fluid and of the substrate is shown by arrows in FIG. 4.

Another arrangement which has been proposed is to provide the liquid supply system with a liquid confinement structure which extends along at least a part of a boundary of the space between the final element of the projection system and the substrate table. Such an arrangement is illustrated in FIG. 5.

Figure 5:
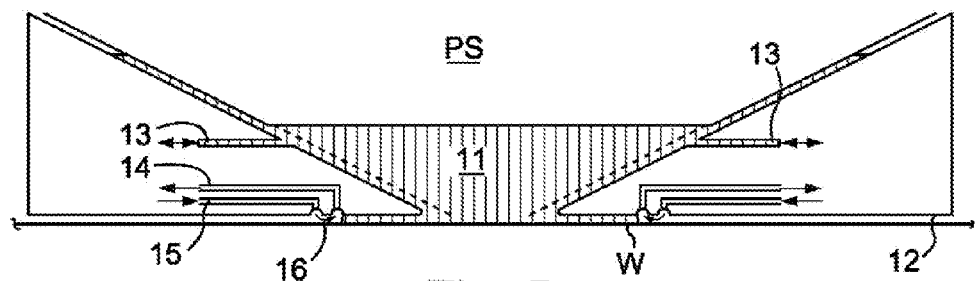
FIG. 5 depicts a further liquid supply system for use in a lithographic projection apparatus.

FIG. 5 schematically depicts a localized liquid supply system or fluid handling structure with a liquid confinement structure 12, which extends along at least a part of a boundary of the space between the final element of the projection system and the substrate table WT or substrate W. (Please note that reference in the following text to surface of the substrate W also refers in addition or in the alternative to a surface of the substrate table, unless expressly stated otherwise.) The liquid confinement structure 12 is substantially stationary relative to the projection system in the XY plane though there may be some relative movement in the Z direction (in the direction of the optical axis). In an embodiment, a seal is formed between the liquid confinement structure and the surface of the substrate W and may be a contactless seal such as a gas seal (such a system with a gas seal is disclosed in European patent application publication no. EP-A-1,420,298) or liquid seal.

The liquid confinement structure 12 at least partly contains liquid in the space 11 between a final element of the projection system PL and the substrate W. A contactless seal 16 to the substrate W may be formed around the image field of the projection system so that liquid is confined within the space between the substrate W surface and the final element of the projection system PL. The space is at least partly formed by the liquid confinement structure 12 positioned below and surrounding the final element of the projection system PL. Liquid is brought into the space below the projection system and within the liquid confinement structure 12 by liquid inlet 13. The liquid may be removed by liquid outlet 13. The liquid confinement structure 12 may extend a little above the final element of the projection system. The liquid level rises above the final element so that a buffer of liquid is provided. In an embodiment, the liquid confinement structure 12 has an inner periphery that at the upper end closely conforms to the shape of the projection system or the final element thereof and may, e.g., be round. At the bottom, the inner periphery closely conforms to the shape of the image field, e.g., rectangular, though this need not be the case.

The liquid may be contained in the space 11 by a gas seal 16 which, during use, is formed between the bottom of the barrier member 12 and the surface of the substrate W. The gas seal is formed by gas, e.g. air or synthetic air but, in an embodiment, $N_2$ or another inert gas. The gas in the gas seal is provided under pressure via inlet 15 to the gap between barrier member 12 and substrate W. The gas is extracted via outlet 14. The overpressure on the gas inlet 15, vacuum level on the outlet 14 and geometry of the gap are arranged so that there is a high-velocity gas flow 16 inwardly that confines the liquid. The force of the gas on the liquid between the barrier member 12 and the substrate W contains the liquid in a space 11. The inlets/outlets may be annular grooves which surround the space 11. The annular grooves may be continuous or discontinuous. The flow of gas 16 is effective to contain the liquid in the space 11. Such a system is disclosed in United States patent application publication no. US 2004-0207824, which is hereby incorporated by reference in its entirety. In another embodiment, the liquid confinement structure 12 does not have a gas seal.

Figure 6:
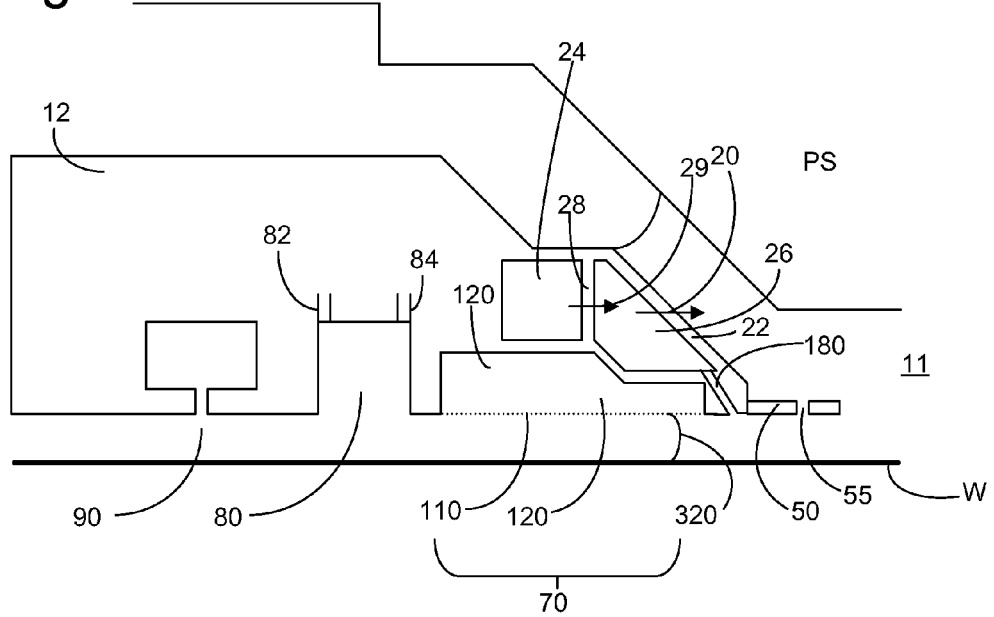
FIG. 6 depicts, in cross-section, a liquid confinement structure and a final element of a projection system according to an embodiment of the invention.

FIG. 6 illustrates a liquid confinement structure 12 which is part of a liquid supply system. The liquid confinement structure 12 extends around the periphery (e.g., circumference) of the final element of the projection system PS.

A plurality of openings 20 in the surface which defines the space 11 provide the liquid to the space 11. The liquid passes through openings 29, 20 in side walls 28, 22 respectively prior to entering the space 11.

A seal is provided between the bottom of the liquid confinement structure 12 and the substrate W. In FIG. 6 a seal device is configured to provide a contactless seal and is made up of several components. Radially outwardly from the optical axis of the projection system PS, there is provided a (optional) flow control plate 50 which extends into the space 11. Radially outwardly of the flow control plate 50 on the bottom surface of the liquid confinement structure 12 facing the substrate W or substrate table WT may be an opening 180. The opening 180 can provide liquid in a direction towards the substrate W. During imaging this may be useful in preventing bubble formation in the immersion liquid by filling a gap between the substrate W and substrate table WT with liquid.

Radially outwardly of the opening 180 may be an extractor assembly 70 to extract liquid from between the liquid confinement structure 12 and the substrate W and/or the substrate table WT. The extractor assembly 70 may operate as a single phase or as a dual phase extractor.

Radially outwardly of the extractor assembly 70 may be a recess 80. The recess 80 is connected through an inlet 82 to the atmosphere. The recess 80 may be connected via an outlet 84 to a low pressure source. Radially outwardly of the recess 80 may be a gas knife 90. An arrangement of the extractor assembly, recess and gas knife is disclosed in detail in United States patent application publication no. US 2006/0158627 incorporated herein in its entirety by reference.

The extractor assembly 70 comprises a liquid removal device or extractor or inlet such as the one disclosed in United States patent application publication no. US 2006-0038968, incorporated herein in its entirety by reference. In an embodiment, the liquid removal device 70 comprises an inlet which is covered in a porous material 110 which is used to separate liquid from gas to enable single-liquid phase liquid extraction. An under pressure in chamber 120 is chosen is such that the meniscuses formed in the holes of the porous material 110 prevent ambient gas from being drawn into the chamber 120 of the liquid removal device 70. However, when the surface of the porous material 110 comes into contact with liquid there is no meniscus to restrict flow and the liquid can flow freely into the chamber 120 of the liquid removal device 70.

The porous material 110 has a large number of small holes each with a dimension, e.g. a width, such as a diameter, in the range of 5 to 50 mm. The porous material 110 may be maintained at a height in the range of 50 to 300 mm above a surface from which liquid is to be removed, e.g. the surface of a substrate W. In an embodiment, porous material 110 is at least slightly liquidphilic, i.e. having a dynamic contact angle of less than 90°, desirably less than 85° or desirably less than 80°, to the immersion liquid, e.g. water.

Although not specifically illustrated in FIG. 6, the liquid supply system has an arrangement to deal with variations in the level of the liquid. This is so that liquid which builds up between the projection system PS and the liquid confinement structure 12 can be dealt with and does not spill. One way of dealing with this liquid is to provide a liquidphobic (e.g., hydrophobic) coating. The coating may form a band around the top of the liquid confinement structure 12 surrounding the opening and/or around the last optical element of the projection system PS. The coating may be radially outward of the optical axis of the projection system PS. The liquidphobic (e.g., hydrophobic) coating helps keep the immersion liquid in the space 11.

The examples of FIGS. 5 and 6 are a so called localized area arrangement in which liquid is only provided to a localized area of the top surface of the substrate W at any one time. Other arrangements are possible, including fluid handling systems which make use of a gas drag principle. The so-called gas drag principle has been described, for example, in United States patent application publication no. US 2008-0212046 and United States patent application publication nos. US 2009-0279060 and US 2009-0279062. In that system the extraction holes are arranged in a shape which desirably has a corner. The corner may be aligned with the stepping and scanning directions. This reduces the force on the meniscus between two openings in the surface of the fluid handing structure for a given speed in the step or scan direction compared to if the two outlets were aligned perpendicular to the direction of scan. An embodiment of the invention may be applied to a fluid handling structure used in all wet immersion apparatus. In the all wet embodiment, fluid is allowed to cover the whole of the top surface of the substrate table, for example, by allowing liquid to leak out of a confinement structure which confines liquid to between the final element of projection system and the substrate. An example of a fluid handling structure for an all wet embodiment can be found in United States patent application publication no. US 2010-0060868.

As will be appreciated, any of the above described features can be used with any other feature and it is not only those combinations explicitly described which are covered in this application.

In an immersion arrangement, there may be a sensor to sense or measure a parameter of the lithographic apparatus.

For example the sensor may be an optical sensor to sense an optical property of the exposure beam or the projection system. The sensor may be located in a position in which it comes into contact with immersion liquid. Immersion liquid is known to be corrosive, so a coating is often applied to the sensor surface, such as a lyophobic (hydrophobic for immersion aqueous liquid) coating to repel the immersion liquid from the surface of the sensor. The exposure radiation is known to damage some surfaces. The coating may protect the sensor from exposure radiation without, and in the presence of, immersion liquid. However, existing coatings may still deteriorate in the presence of immersion liquid and/or exposure radiation. Deterioration of the coating may allow components of a sensor to come into contact with immersion liquid in the presence of exposure radiation, facilitating the degradation of the sensor. Alternatively or additionally a small defect or opening in the protective coating may allow immersion liquid to propagate between the protective coating and sensor. Thus, a component of the sensor beneath the coating, such as a metal mask, may corrode or be etched away after the immersion liquid has propagated between the protective coating and sensor. A sensor which has degraded features may degrade in performance through use, becoming a source of inaccurate measurements. The lifetime of the sensor may be reduced, increasing the downtime of the lithographic tool used for replacing the sensor. The degraded sensor may be a source of contamination, and thus defectivity, decreasing the performance of the lithographic apparatus. An embodiment of the invention alleviates one or more problems described herein or one or more other problems.

One possible cause of the degradation of the protective coating may be the dislocation density. The dislocation density in the protective coating may be too great to limit the breakdown of the protective coating. The dislocations may induce strain forces in the coating. Attack by the immersion liquid and/or the exposure radiation may damage the surface of the coating. The strain and stress forces may be focused at the damaged surface enabling the forces to be relieved and the damage to spread through the surface, causing the coating to degrade.

In an embodiment of the invention, the sensor is covered with a transparent layer that is resistant to damage which may be caused by the immersion liquid and/or the exposure radiation. An advantage of the transparent layer is that it may prevent contamination of the sensor (e.g., pattern Pa discussed below) by foreign matter and improves cleanability (as is described in more detail with reference to the embodiments of FIGS. 13-15).

Figure 7:
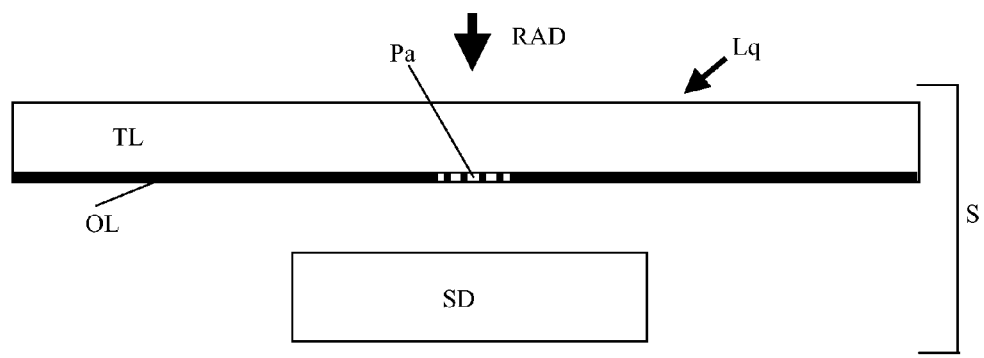
FIG. 7 depicts, in cross-section, a sensor according to an embodiment of the invention.

A sensor according to an embodiment of the invention is shown in FIG. 7. The sensor S has a sensing device SD to sense a property of a beam of radiation RAD incident on the sensor S. The sensor has a transparent layer TL. The transparent layer TL is at least partly transparent to the beam of radiation RAD to allow passage of the beam of radiation RAD therethrough. The transparent layer TL may cover the sensing device SD. Desirably the transparent layer is resistant to attack by immersion liquid, such as ultra pure water, or exposure radiation, or both simultaneously. Therefore, in use for example, in an immersion system the transparent layer may protect the sensing device from degradation. The transparent layer TL may be made of a material which is cleanable. For example, the transparent layer TL may be made of a material which can be cleaned by passing immersion liquid over it or a cleaning liquid over it.

The sensor S may have an opaque layer OL. The opaque layer may be located between the transparent layer TL and the sensing device SD. The opaque layer may have a patterned region which features a pattern Pa. The pattern of the opaque layer may impart a pattern to a beam of beam of radiation RAD which passed through the transparent layer.

In the embodiment of FIG. 7 the top surface of the transparent layer TL, which is directed away from the sensing device SD and may come into contact with the immersion liquid Lq, may be impervious to immersion liquid. This may help to prevent the immersion liquid from reaching the opaque layer OL or the sensing device SD. If immersion liquid comes into contact with the opaque layer OL or the sensing device SD, they may degrade. As a result, the performance of the sensor may deteriorate. Thus, as the transparent layer covers the patterning layer and the sensing device, the patterning layer and the sensing device do not come into contact with the immersion liquid. As a result the degradation of the patterning layer is reduced, improving the lifetime of the sensor. In improving the lifetime of the sensor, the downtime of the lithographic apparatus, which is otherwise needed to replace the sensor, can be reduced.

In the patterned region, the pattern Pa forms openings in the opaque layer, through which the beam of radiation RAD may pass. The openings may be filled with an infilling material. The infilling material is at least partly transparent to the beam of radiation RAD. The infilling material may have a similar refractive index to that of the transparent layer TL. Degradation of the optical properties of the beam of radiation RAD passing through the pattern Pa can be reduced. Undesired reflections or diffractions may be prevented or reduced. Therefore, the beam of radiation does not propagate undesirably from the transparent layer through the infilling material. There is minimal, if not no, loss of radiation or detriment to the sensor performance. This may be significant in an embodiment in which the infilling material in the openings of pattern Pa are in a part of the path of the beam of radiation RAD in the direction of the sensing device SD.

The infilling material may have a similar coefficient of thermal expansion as the material which constitutes the transparent layer TL. The infilling material and the transparent layer TL may have the same coefficient of thermal expansion. This can help to reduce the mechanical stress between the infilling material and the transparent layer TL in case there is a change in temperature of the sensor S. Mechanical stress can cause deformation of the sensor S and this can reduce the performance of the sensor S. Thermal stresses induced by thermal expansion may thus be minimized or otherwise reduced.

As the transparent layer TL may come into contact with the immersion liquid Lq, it is desirable that the transparent layer TL is resistant to the immersion liquid whether or not in combination with the beam of radiation RAD. It is desirable that the transparent layer is made of a material which is sufficiently resistant to attack by immersion liquid and/or the beam of radiation. The transparent layer TL may be made of a suitable resistant material which is transparent to the exposure radiation, such as fused quartz, fused silica, double fused quartz or double fused silica. Other glasses or transparent ceramics that are immersion liquid resistant and at least partly transparent to the beam of radiation RAD may be used.

The infilling material may be a similar material as the transparent layer. In an embodiment, the infilling material is the same material as the material used in the transparent layer. It is desirable that the infilling material is the same material as the transparent material. The facing surfaces of the infilling material and the transparent layer may be made planar, e.g. flat. These features facilitate contact bonding between the opaque layer and the transparent layer, particularly in the patterned region for example by way of the infilling material.

Contact bonding may be referred to as 'ansprengen'. By contact bonding the surfaces of the transparent layer and the infilling material that come into contact together, the surfaces can be bonded together without the need of any additional material, such as glue. Gaps between the infilling material and the transparent layer may be avoided because they are in contact. Contact bonding securely secures the infilling material, and thus the opaque layer, to the transparent layer.

In one embodiment a block of transparent material is processed (e.g. carved or etched or machined) to form a pattern in a bottom surface. The recesses of the pattern are then filled with opaque material. In this way the transparent layer TL and pattern Pa are formed. The opaque layer OL may be deposited at the same time. Thus the infilling material is part of the transparent material or layer (e.g. part of the same block of material).

In the embodiment of FIG. 7 the transparent layer TL is a plate, desirably with a flat surface. A plate shaped sensor may easily be fitted in a part of a lithographic apparatus, for example a table such as a substrate table or a measurement table. Other layers, such as the opaque layer OL, can easily be applied to the transparent layer TL, for example by contact bonding by way of the infilling material, especially if it has the same planar shape as the transparent later TL, for example as a plate. The transparent layer may have any suitable shape, so may not be a plate. In an embodiment, the transparent layer TL is a cuboid, e.g. a cube, or has a curved surface, for example a cylinder.

Figure 8:
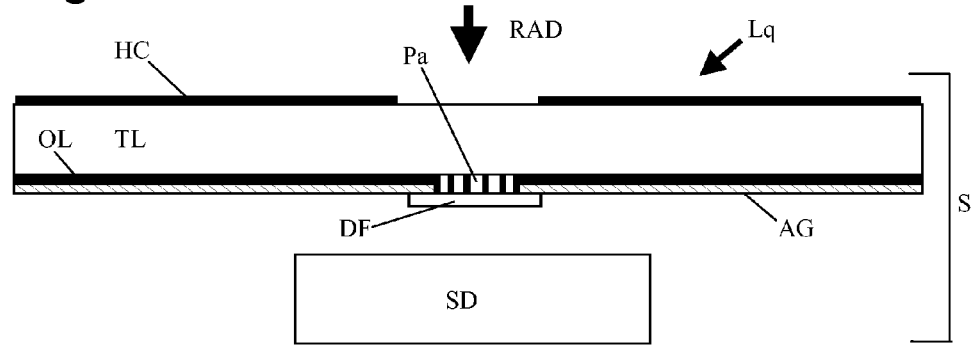
FIG. 8 depicts a sensor according to a further embodiment of the invention.

FIG. 8 illustrates an embodiment of the invention in which the top surface of the transparent layer TL is at least partly lyophobic. The top surface may have a lyophobic (for example hydrophobic for water) coating HC. The lyophobic coating HC helps prevent a droplet of immersion liquid Lq remaining on the top surface of the sensor S. As the surface is lyophobic, a droplet may be readily removed from the surface by a fluid handling structure. If a droplet is not removed from the sensor by the fluid handling system, it may evaporate, causing an undesired local cooling of the sensor. This may reduce the accuracy of the sensor or the thermal stability of the part of the lithographic apparatus in which the sensor is mounted. Additionally or in the alternative, the transparent layer TL is made of a material which exhibits a lyophobic surface property.

Particularly in an all wet immersion apparatus in which liquid is allowed to cover the substantially whole of the top surface of the substrate table WT, the top surface of the transparent layer TL may be at least partly lyophilic. The top surface may have a lyophilic (for example hydrophilic for water) coating HC. The lyophilic coating HC helps to improve wetting of the layer of immersion liquid on the top surface of a sensor S. That is, the lyophilic coating HC ensures a continuous layer of immersion liquid over the sensor S.

The coating HC may be applied to the complete top surface of transparent layer TL. The coating may not be resistant to attack from exposure radiation, or exposure radiation in the presence of immersion liquid. In an embodiment, the coating HC may be absent from the part of the top surface through which the beam of radiation RAD passes when it is directed at the sensing device SD. So the coating HC may be away from the part of the top surface which is in the path of the radiation beam, i.e., where the radiation beam RAD is not incident on the coating during measurement by the sensor. The deterioration rate of the coating HC may be slower (if not stopped) in that situation than if the coating HC was present in the path of the radiation beam. Fewer, if not no, particles from the sensor, such as the coating HC, may contaminate a part of the lithographic apparatus such as the immersion system.

The top surface of the transparent layer may be free of patterning. The surface may be substantially planar, e.g. flat. A planar surface may facilitate removal of liquid, for example in the form of a droplet. A planar surface may help prevent a droplet from remaining, e.g. sticking, to the surface.

As contact between the immersion liquid Lq and the opaque layer OL is prevented by the transparent layer TL, the opaque layer may be made of a material which corrodes when in contact with the immersion liquid Lq, whether or not in combination with the beam of radiation RAD. For example, the opaque layer may comprise a metal, such as chromium or chromium oxide. A material for the opaque layer may be chosen that has good optical properties (i.e. in its opacity), but a low resistance to immersion liquid Lq.

In the embodiment illustrated in FIG. 8, an optical component, in this case a diffuser DF, is provided to the sensor S. Such an optical component may alter one or more properties of the beam of radiation RAD and can be useful to improve the performance of the sensor S. The diffuser DF may prevent refraction of a high NA beam of radiation. A high NA beam is incident on the sensing device SD at a small angle relative to the surface of the pattern Pa. Even though the direction of the beam of radiation RAD is depicted vertically in FIG. 8, if the beam of radiation is a high NA beam, the direction may have a large horizontal component. The diffuser DF added to the surface of the pattern Pa, results in less radiation being reflected back into the transparent layer TL and more radiation being directed towards the sensing device SD. It can be desirable to have the diffuser DF in direct contact to the patterned region in which the pattern Pa is formed. In one embodiment, the diffuser DF is applied to the opaque layer OL and/or the infilling material of the pattern Pa such that there is no gas (e.g., air) gap or any gap is smaller than one twentieth of the wavelength used (e.g. less than 12 nm). This can be done by contact bonding (ansprengen). By making the surfaces of the pattern Pa and the diffuser DF that come into contact with each other very flat, they can be bonded together without the need of any additional material, such as glue. Gaps between the pattern Pa and the diffuser DF can be prevented. This way, deterioration of the beam of radiation when passing from the pattern Pa to the diffuser DF can be reduced or minimized. Additionally or alternatively, the diffuser DF may be glued e.g. to the layer AG of the FIG. 8 embodiment. In an embodiment the diffuser DF may be applied to the opaque layer OL, for example by deposition and/or etching and/or ion beam techniques. Alternatively, the diffuser DF may be glued to the opaque layer OL. In an embodiment the diffuser DF is contact bonded to the pattern Pa and the edges of the diffuser DF glued to the opaque layer OL. Undesired diffraction, reflection and absorption may be prevented. The optical diffuser may comprise YAG:Ce, or comprises a part which consists of YAG:Ce.

Instead of a diffuser DF, as depicted in FIG. 8, one or more other optical components, such as a convex or concave lens, may be used. The other optical component may be secured to the patterned region by contact bonding. In an embodiment the sensing device SD contacts the patterned region.

In an alternative embodiment, instead of a diffuser DF, an optical component with a luminescent material may be used to alter the wavelength of the beam of radiation RAD, for example to a longer wavelength. Radiation with a longer wavelength than deep ultraviolet (DUV) may cause less deterioration to the sensing device SD. Therefore a sensing device SD may be used which is UV-resistant but not DUV-resistant.

As shown in FIG. 8, an embodiment may comprise a layer AG between the sensing device SD and the opaque layer OL. The layer AG may comprise an amorphous material, such as an amorphous ceramic or oxide of silicon. The layer AG may be transparent or opaque because radiation does not reach it.

The further layer AG may be deposited onto the opaque layer OL, for example the undersurface of the opaque layer OL. The further layer AG may be made, at last partly, very flat and coplanar with the surface of the patterned region which contacts the diffuser DF. In this way the contact bonding surface can be increased in surface area. The connection of the diffuser DF with the opaque layer OL and/or layer AG can be improved.

In one embodiment the sensor S may be made by etching a pattern into the bottom surface of the transparent layer TL. A known etching method may be employed for this. The etched pattern may be partly filled with opaque (or reflective) material to form the opaque layer OL of FIGS. 7, 8, 10 and 12 or the patterned reflective layer PRL of FIG. 11. In this embodiment the infilling material is part of the transparent layer TL. Thus the pattern Pa may partly reflect radiation and also have attenuation properties to suppress the remainder of the non-reflected radiation. The further layer AG of FIG. 8 may be deposited onto the opaque layer OL such that the thickness of the combined opaque layer OL and further layer AG exceeds the depth of the pattern etched into the transparent layer TL. The further layer AG may be polished to make its outer surface planar. Desirably the outer surface of the further layer AG is coplanar with the surface of the transparent layer TL onto which the opaque layer or pattern reflective layer is deposited. In an alternative embodiment, the complete height of the etched pattern in the transparent layer TL may be filled with opaque (or reflective) material.

In an embodiment, the sensor is solid material, at least along the path of the beam of radiation RAD. This may improve an optical property of the sensor S, as undesired reflection or diffraction can be reduced. Having no gaps between the different layers of the sensor S may improve the optical properties. As described herein, using an infilling material which is in contact with a protective transparent layer and optionally an optical component such as a diffuser enables there to be solid material between the top surface of the transparent layer and the optical component, i.e. the sensing device. Hence there are no gaps between the top surface of the transparent layer and the sensing device, for example in the path of the beam of radiation.

The sensor S may be an active sensor. This means that the sensing device SD is an active component, for example a radiation sensor configured to send a signal dependent on a property of the beam of radiation RAD to a control system or measurement system. Examples of active sensors include a transmission image sensor (TIS) sensor, a dose sensor (e.g. a spot sensor or a slit sensor), and/or a lens interferometer (ILIAS). TIS and ILIAS are described below.

A TIS is a sensor that may be used to measure the position at substrate W level of a projected aerial image of a mark pattern at the patterning device M level. The projected image at substrate W level may be a line pattern with a line width comparable to the wavelength of the exposure radiation. The TIS measures this mark pattern using a transmission pattern with a photocell underneath it. The sensor data may be used to measure the position of the patterning device M with respect to the substrate table WT in six degrees of freedom (three in translation and three in rotation). In addition, the magnification and scaling of the projected patterning device M pattern may be measured. Since the sensor is capable of measuring the pattern positions and influences of all illumination settings (sigma, projection system NA, all patterning devices (binary, PSM, etc.)) a small line width is desirable. The TIS may also or alternatively be used to measure the optical performance of the tool. Different illumination settings are used in combination with different projected images for measuring properties such as pupil shape, coma, spherical aberration, astigmatism and field curvature.

An ILIAS is an interferometric wavefront measurement system that may perform static measurements on lens aberrations up to high order. It may be implemented as an integrated measurement system used for system initialization and calibration. Alternatively, it may be used for monitoring and recalibration "on-demand".

The sensor S may be a passive sensor, for example an encoder grid. As a passive sensor, sensor S may transmit the beam of radiation RAD incident on the sensing device SD, from the sensing device SD to an active component. The sensing device SD may be a mirror, lens or other optical component.

Figure 9:
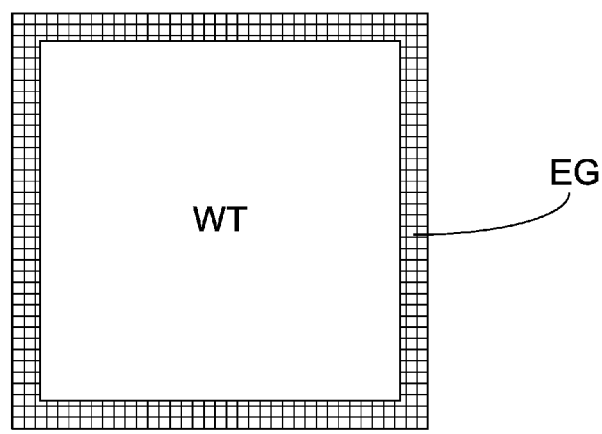
FIG. 9 depicts, in plan, a substrate table.

FIG. 9 illustrates, in plan, a substrate table WT according to an embodiment of the present invention. Mounted around the edge of the substrate table WT is an encoder grid EG. The encoder grid EG may be as described above or may be as illustrated and described with reference to any one of FIGS. 10-12. The encoder grid EG is a sensing component of an encoder system. An emitter and sensor are provided in a known position relative to the projection system PS and mounted above the substrate table WT. The emitter sends a beam of radiation to the encoder grid EG. The beam of radiation then interacts with the pattern Pa of the encoder grid EG before being redirected back towards the sensor. The position of the substrate table WT relative to the projection system PS may then be calculated based on the received redirected beam. The encoder system desirably comprises at least three sets of emitter and sensor, desirably at least four. In an embodiment, the positions of encoder grid EG and emitter/sensor may be reversed so that the encoder grid is mounted in known relationship to the projection system PS and the emitter/sensor is mounted on the substrate table WT.

Figure 10:
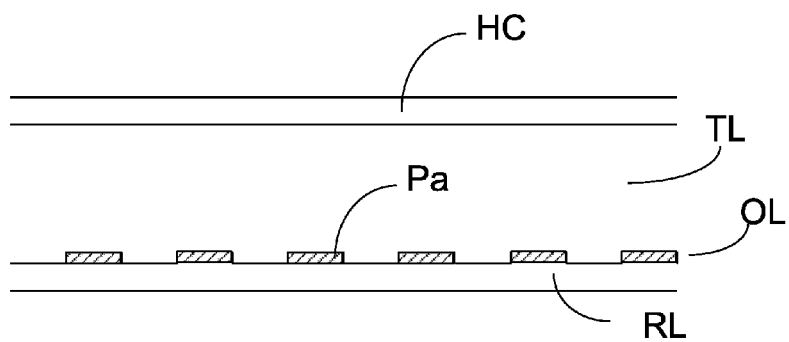
FIG. 10 depicts, in cross-section, an encoder grid according to an embodiment of the invention.

FIG. 10 illustrates, in cross-section, an encoder grid EG of an embodiment. The encoder grid EG of FIG. 10 is the same as the embodiment of FIG. 8 except as described below. The encoder grid EG has a pattern Pa, which in the embodiment of FIG. 10 is an opaque layer. The pattern Pa has openings in the opaque layer, through which the beam of radiation RAD may pass. The openings may be filled with an infilling material, as described above in relation to the embodiment of FIG. 7. In the embodiment of FIG. 10 the infilling material is material of the transparent layer TL. The transparent layer TL may be the same as described above in relation to FIGS. 7 and 8.

Formed on the opposite side of the opaque layer OL to the transparent layer TL is a reflective layer RL. The reflective layer RL reflects the parts of the beam of radiation RAD which pass through the openings in the opaque layer OL back through the transparent layer TL to the sensor associated with the emitter from which the beam of radiation RAD has been emitted.

In contrast to the embodiments of FIGS. 7 and 8, the pattern Pa is not limited to a small area of the opaque later OL but, as illustrated in FIG. 9, extends over the majority of the encoder grid EG, in plan.

In the embodiment of FIG. 10 the top surface of the transparent layer TL is at least partly lyophobic, as in the embodiment of FIG. 8. As is illustrated, the top surface may have a lyophobic (for example hydrophobic for water) coating HC. The purpose of the lyophobic coating HC is the same as for the embodiment of FIG. 8. The presence of the lyophobic coating HC is optional. The lyophobic coating may be desirable, for an apparatus in which immersion liquid is localized and needs to pass over the encoder grid EG, for example during substrate table WT swap under the projection system PS. In contrast to the sensor of FIG. 8, the lyophobic coating HC covers the whole of the top surface of the encoder grid EG. This is because the beam of radiation RAD of the emitter of the encoder system may be chosen such that it does not degrade the lyophobic coating HC.

Figure 11:
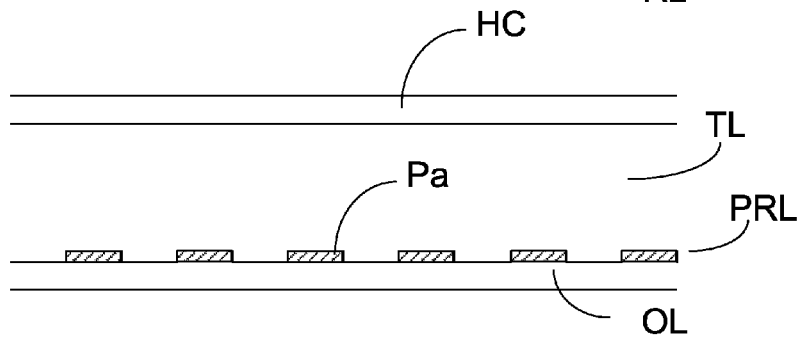
FIG. 11 depicts, in cross-section, an encoder grid according to an embodiment of the invention.

FIG. 11 illustrates a further embodiment of an encoder grid EG. The embodiment of FIG. 11 is the same as that of FIG. 10 except as described below. The materials of the pattern Pa and reflective layer are effectively swapped around. In the embodiment of FIG. 11, the opaque layer OL is formed on the other side of the transparent layer TL to the pattern Pa. The opaque layer OL is continuous. The pattern Pa is formed in a patterned reflective layer PRL. Thus the beam of radiation RAD passes through openings in the patterned reflective layer PRL and is absorbed in the opaque layer OL. Radiation impinging on the parts of the patterned reflective layer PRL which are maintained in the pattern Pa are reflected back through the transparent layer TL to the sensor of the associated emitter from which the beam of radiation RAD has been emitted. As in the embodiment of FIG. 10, the infilling material is the transparent layer TL.

Figure 12:
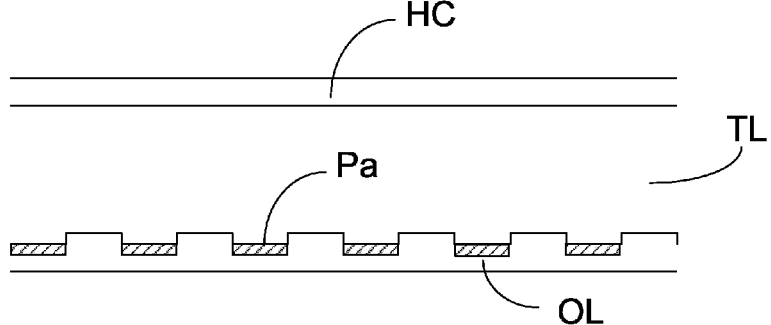
FIG. 12 depicts, in cross-section, an encoder grid according to an embodiment of the invention.

FIG. 12 illustrates a further embodiment of encoder grid EG. The FIG. 12 embodiment is the same as the FIG. 11 embodiment except as described below. In the FIG. 12 embodiment the infilling material is formed by the opaque layer OL. Optionally the pattern Pa may also extend into the transparent layer TL as illustrated so that the bottom of the transparent layer TL comprises a series of grooves and ridges.

In each of the embodiments of FIGS. 10-12, the transparent layer TL is desirably of a fused silica.

Figure 13:
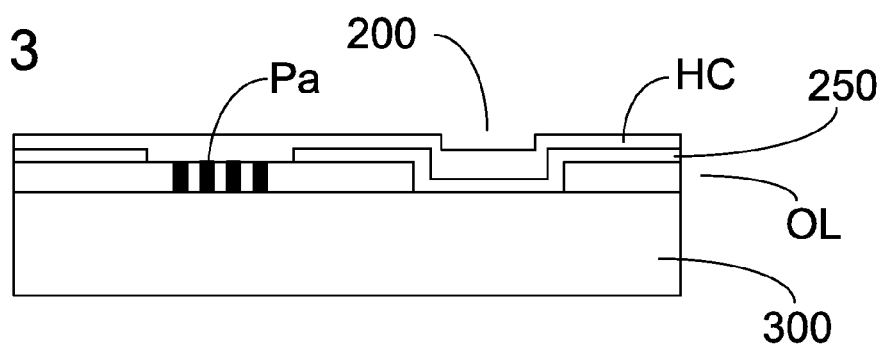
FIG. 13 depicts, in cross-section, a sensor according to an embodiment of the invention.
Figure 14:
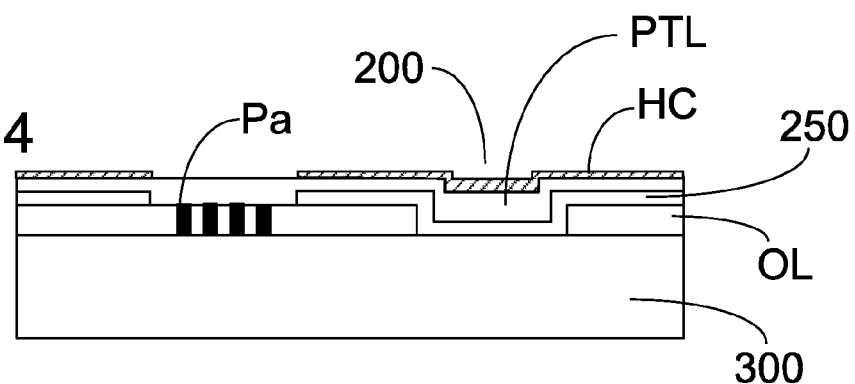
FIG. 14 depicts, in cross-section, a sensor according to an embodiment of the invention.

A sensor often has a pattern which comes into contact with immersion liquid. One difficulty with the use of a pattern on a sensor is that organic and/or non-organic contamination can find its way into the openings between adjacent opaque or reflective parts of the opaque layer OL or patterned reflective layer PRL. Build-up of such contamination can lead to the need to exchange an old sensor for a new sensor leading to downtime. Organic contamination can to some extent be removed using DUV light. However, inorganic contamination cannot be cleaned in this way and may stay in such a pattern. Inorganic contamination cannot be cleaned manually, for example by wiping particles away. This is because the particles are located in the openings in the pattern and therefore cannot be removed by wiping. In addition, manual cleaning may lead to damage of the pattern Pa even when a low force is applied. In the embodiments of FIGS. 13 and 14 a coating layer is added over the pattern Pa. The coating layer makes the sensor surface planar. A planar surface (such as the top surface of the FIG. 7 embodiment) is advantageous because it prevents particle contamination from entering the gaps between the pattern Pa as well as allowing a manual cleaning of the sensor, for example wiping, when needed.

Figure 15:
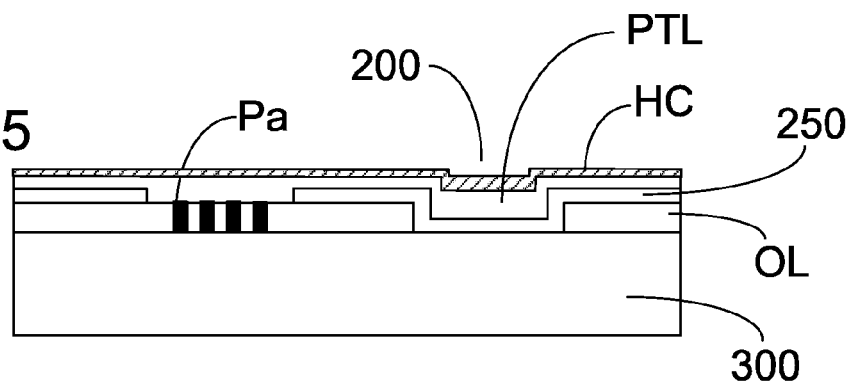
FIG. 15 depicts, in cross-section, a sensor according to an embodiment of the invention.
Figure 16:
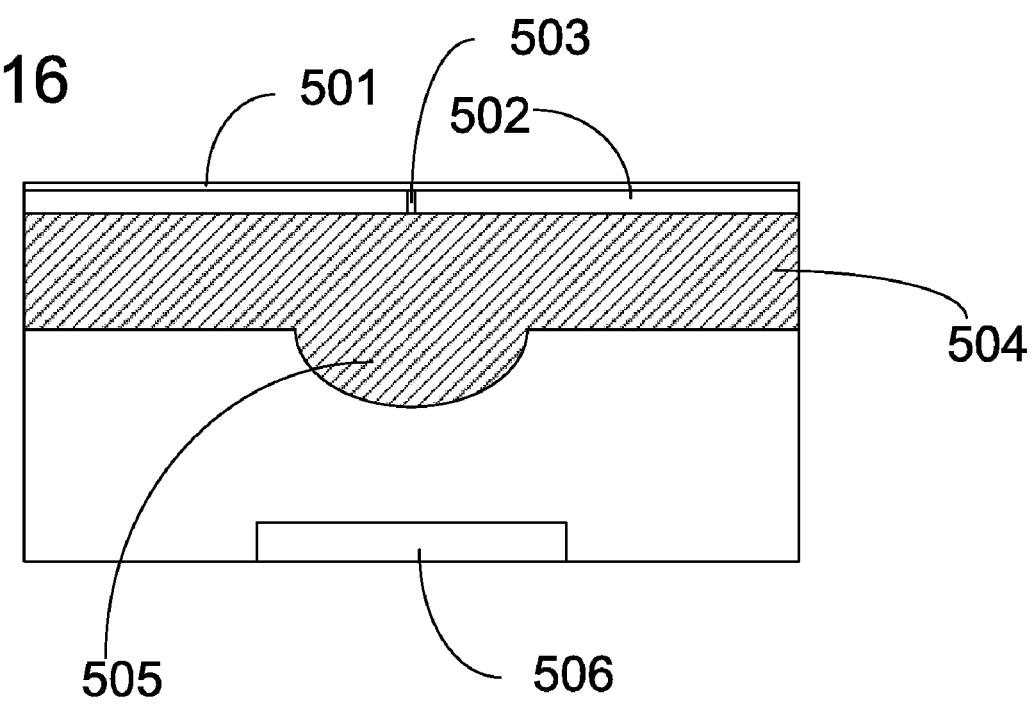
FIG. 16 depicts, in cross-section, a sensor according to the prior art.

If the transparent layer TL is quite thick (100-400 µm), this can make the optical properties of a sensor less flexible. The embodiments of FIGS. 13-15 provide a way in which the material above the sensing device SD can be made thin (e.g. less than 1 µm). This may be advantageous for a TIS sensor.

The embodiment of FIG. 13 illustrates a TIS sensor. The sensor is the same as the sensor of FIG. 7 except as described below. The pattern Pa is formed in an opaque layer OL. However, there is not necessarily any infilling material in the openings in the patterned region. The opaque layer OL may be made of a chromium/chromium oxide layer, for example about 100 nm thick e.g. 105 nm thick. An opening is formed at an alignment mark 200. A layer of TiN 250 approximately 60 nm thick is placed over the opaque layer OL in all regions except for above the pattern Pa. This layer has a DUV attenuation function, for suppression of stray radiation and mark to mark cross talk. A lyophobic coating HC, e.g. a hydrophobic coating, (of about 100 nm-1 µm thickness) is coated over the entire top surface of the sensor. This is a solution in which the lyophobic coating HC is DUV resistant. The lyophobic coating HC covers the pattern Pa thereby planarizing the surface of the sensor. The presence of a recess above the alignment mark is not deleterious because this mark is less sensitive to contamination than the pattern Pa. All of these layers may be made on a quartz substrate 300, below which a sensing device SD would be positioned.

FIG. 14 is a further embodiment of a sensor. The embodiment of FIG. 14 is the same as that of FIG. 13 except as described below. It may not be possible to find a lyophobic coating HC which is resistant to DUV radiation. In this case it is possible to place a planarizing transparent layer PTL, for example of $SiO_2$, over the opaque layer OL and TiN layer 250. If required, a lyophobic coating HC (of about 500 nm thickness), which may be hydrophobic, may be provided over the planarizing transparent layer PTL in all regions except over the pattern Pa. Thus the DUV radiation which impinges on the pattern Pa does not need to impinge on the lyophobic coating HC so that its lack of resistance to DUV radiation is not a problem. In the embodiments of FIGS. 13 and 14 the beam of radiation RAD only has to pass through a thin layer of lyophobic coating HC or a thin layer of planarizing transparent layer PTL before reaching pattern Pa. This may reduce the amount of distortion of the beam of radiation RAD, improving the performance of the sensor.

The thickness of the various layers may be varied to suit the situation. For example a total layer thickness may need to be adjusted to achieve a desired effective phase depth. For example the distance between the top and bottom of the pattern Pa may be desirably an integer multiple of half the wavelength of incident radiation. It may be possible to optimize the coating thickness to get optimal signal strength for more than one wavelength (SMASH/ATHENA sensors operate with more than one wavelength of radiation, for example). In general the total thickness of the layers is desirably less than 500 nm.

In an alternative embodiment, the structure is the same as that illustrated in FIG. 14 except that the position of layers PTL and 250 in the stack is swapped.

FIG. 15 is a further embodiment of a sensor. The embodiment of FIG. 15 is the same as that of FIG. 14 except as described below. If a lyophobic coating HC which is resistant to DUV radiation is available, the lyophobic HC coating of FIG. 14 may be made to cover the whole of the surface of the sensor. That is, the gap in the lyophobic coating HC above the pattern Pa does not need to be present. Example thicknesses of the various layers in the FIG. 15 embodiment are as follows: opaque layer 105 nm, TiN layer 250 65 nm, planarizing transparent layer PTL of $SiO_2$ 500 nm-1 µm, and lyophobic coating HC 100-500 nm.

In an embodiment, the sensor S is provided to a lithographic apparatus. In another embodiment, the sensor S is provided to a table of a lithographic apparatus. The table may be a substrate table configured to support a substrate W and a sensor, or a measurement table which may not support a substrate and which may have a sensor.

Even though the lifetime of the sensor S may be improved, it may still be desirable to remove the sensor S from the table occasionally, for example for maintenance of the table or sensing device SD. Therefore, the sensor S may be releasably attachable to the table.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm). The term "lens", where the context allows, may refer to any one or combination of various types of optical components, including refractive and reflective optical components.

In an embodiment, there is provided a sensor for an immersion system, the sensor comprising a sensing device, a transparent layer and an opaque layer. The sensing device is configured to sense a property of a beam of radiation. The transparent layer is configured to allow the passage of the beam of radiation therethrough. The transparent layer covers the sensing device. The opaque patterning layer is located between the transparent layer and the sensing device and is configured to impart a pattern to the beam of radiation. In the patterning layer is an opening and located in the opening is an infilling material that is transparent to the beam of radiation and has a similar refractive index to that of the transparent layer.

The infilling material may lie in part of the path of a beam of radiation directed at the sensing device. The infilling material may have a similar thermal coefficient of expansion as the transparent layer. The infilling material may be contact bonded to the transparent layer.

The transparent layer may comprise double fused silica. The transparent layer may be a plate. The transparent layer may have an outward surface directed away from the sensing device and the outward surface may be impervious to immersion liquid. The outward surface may be hydrophobic.

The outward surface may have a hydrophobic coating. The hydrophobic coating may be substantially absent from a part of the surface which lies in a path of radiation directed at the sensing device. The hydrophobic coating may be present away from a part of the transparent surface which lies in a path of radiation directed at the sensing device. An opening may be formed in the coating in a location corresponding to the part of the transparent surface.

The patterning layer may comprise a degradable material which is corrodible in contact with immersion liquid. The degradable material may degrade on exposure to a beam of radiation used for exposure in a lithographic process. The degradable material may comprise a metal.

Between the sensing device and the patterning layer may be an optical diffuser. The optical diffuser may comprise YAG:Ce.

In an embodiment the sensor may comprise a further transparent layer between the sensing device and the patterned layer. The further transparent layer may be amorphous. The further layer may comprise an oxide of silicon.

At least along the path of a beam of radiation, the sensor may be all solid material. There may be no gaps between the different layers of the sensor.

The sensor may be an active sensor such as a transmission image sensor, a dose sensor, a lens interferometer, or a spot sensor. The sensor may be a passive sensor.

The sensor may be constructed and arranged to be releasably attachable to a table of a lithographic apparatus.

In an embodiment, there is provided a table for a lithographic apparatus comprising a sensor as described above. In an embodiment, there is provided a lithographic apparatus comprising a sensor as described above. The sensor may be comprised in a table. In an embodiment the table may be a substrate table configured to support a substrate, or a measurement table configured to confine immersion liquid in an immersion space defined by a projection system, a liquid confinement structure and the table. The projection system is configured to direct a patterned beam of radiation through the immersion liquid.

The lithographic may further comprise a projection system and a liquid confinement structure. The projection system is configured to direct a patterned beam of radiation through the immersion liquid and the liquid confinement structure is configured to confine immersion liquid in an immersion space.

In an embodiment, there is provided a sensing component for an immersion system. The sensing component comprises a transparent layer and a patterning layer. The transparent layer is configured to allow the passage of a beam of radiation therethrough. The patterning layer is configured to impart a pattern to the beam of radiation and is covered by the transparent layer. The patterning layer is an opening in which is located an infilling material that is transparent to the beam of radiation and has a similar refractive index to that of the transparent layer. The patterning layer may be opaque.

The sensing component may further comprise a reflector to direct the radiation beam back through the transparent layer.

The patterning layer may be reflective to direct the radiation beam back through the transparent layer.

The sensing component may further comprise an opaque layer. The patterning layer may be between the transparent layer and the opaque layer.

The sensing component may be passive.

The infilling material may be the same as the material of the transparent layer. The infilling material may be part of the same block of material as the transparent layer.

The sensing component may be an encoder grid.

In an embodiment, there is provided an encoder comprising the sensing component described above.

In an embodiment, there is provided a sensor for an immersion system, the sensor comprising a sensing device, a transparent layer and a patterning layer. The sensing device is configured to sense a property of a beam of radiation. The transparent layer is configured to allow the passage of a beam of radiation therethrough. The patterning layer is located between the transparent layer and the sensing device. The patterning layer is configured to impart a pattern to the beam of radiation. The transparent layer has a surface directed away from the sensing device and the surface is substantially planar and a lyophobic coating is on the surface.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

Controllers described herein may each or in combination be operable when the one or more computer programs are read by one or more computer processors located within at least one component of the lithographic apparatus. The controllers may each or in combination have any suitable configuration for receiving, processing, and sending signals. One or more processors are configured to communicate with the at least one of the controllers. For example, each controller may include one or more processors for executing the computer programs that include machine-readable instructions for the methods described above. The controllers may include data storage medium for storing such computer programs, and/or hardware to receive such medium. So the controller(s) may operate according the machine readable instructions of one or more computer programs.

One or more embodiments of the invention may be applied to any immersion lithography apparatus, in particular, but not exclusively, those types mentioned above and whether the immersion liquid is provided in the form of a bath, only on a localized surface area of the substrate, or is unconfined. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion fluid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more fluid openings including one or more liquid openings, one or more gas openings or one or more openings for two phase flow. The openings may each be an inlet into the immersion space (or an outlet from a fluid handling structure) or an outlet out of the immersion space (or an inlet into the fluid handling structure). In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The descriptions above are intended to be illustrative, not limiting. Thus, it will be apparent to one skilled in the art that modifications may be made to the invention as described without departing from the scope of the claims set out below.

The invention claimed is:

1. A sensor for an immersion system, the sensor comprising:
   a sensing device configured to sense a property of a beam of radiation;
   a transparent layer configured to allow the passage of the beam of radiation therethrough, the transparent layer covering the sensing device, the transparent layer having an outward surface directed away from the sensing device, the outward surface being impervious to immersion liquid, and the outward surface is hydrophobic or has a hydrophobic coating; and
   an opaque patterning layer located between the transparent layer and the sensing device, the patterning layer configured to impart a pattern to the beam of radiation wherein in the patterning layer is an opening and located in the opening is an infilling material that is transparent to the beam of radiation and has a similar refractive index to that of the transparent layer.

2. The sensor of claim 1, wherein the infilling material lies in part of the path of a beam of radiation directed at the sensing device.

3. The sensor of claim 1, wherein the infilling material has a similar thermal coefficient of expansion as the transparent layer.

4. The sensor of claim 1, wherein the transparent layer comprises double fused silica.

5. The sensor of claim 1, wherein the hydrophobic coating is substantially absent from a part of the surface which lies in a path of radiation directed at the sensing device.

6. The sensor of claim 1, wherein the patterning layer comprises a degradable material which is corrodible in contact with immersion liquid.

7. The sensor of claim 1, wherein between the sensing device and the patterning layer is an optical diffuser.

8. The sensor of claim 1, comprising a further transparent layer between the sensing device and the patterned layer.

9. The sensor of claim 8, wherein the further layer comprises an oxide of silicon.

10. The sensor of claim 1, wherein at least along the path of a beam of radiation, the sensor is all solid material.

11. The sensor of claim 1, wherein the sensor is an active sensor.

12. The sensor of claim 1, wherein the sensor is a passive sensor.

13. The sensor of claim 1, wherein the infilling material is the same as the material of the transparent layer.

14. A sensing component for an immersion system, the sensing component comprising:
   a transparent layer configured to allow the passage of a beam of radiation therethrough; and
   a patterning layer configured to impart a pattern to the beam of radiation and covered by the transparent layer, wherein in the patterning layer is an opening in which is located an infilling material that is transparent to the beam of radiation and has a similar refractive index to that of the transparent layer and wherein the patterning layer is reflective to direct the radiation beam back through the transparent layer.

15. The sensing component of claim 14, wherein the infilling material is the same as the material of the transparent layer.

16. The sensing component of claim 14, wherein the transparent layer has an outward surface directed away from the patterning layer, the outward surface being impervious to immersion liquid, and the outward surface is lyophobic or has a lyophobic coating.

17. The sensing component of claim 16, wherein the lyophobic coating is substantially absent from a part of the surface which lies in a path of radiation directed at the patterning layer.

18. A sensor for an immersion system, the sensor comprising:
   a sensing device configured to sense a property of a beam of radiation;

a transparent layer configured to allow the passage of a beam of radiation therethrough; and a patterning layer located between the transparent layer and the sensing device, the patterning layer being configured to impart a pattern to the beam of radiation, wherein the transparent layer has a surface directed away from the sensing device and the surface is substantially planar and a lyophobic coating is on the surface.

19. The sensor of claim 18, wherein the lyophobic coating is substantially absent from a part of the surface which lies in a path of radiation directed at the sensing device.

20. The sensor of claim 18, wherein between the sensing device and the patterning layer is an optical diffuser.

* * * * *

UNITED STATES PATENT AND TRADEMARK OFFICE
CERTIFICATE OF CORRECTION

| | | |
|---|---|---|
| PATENT NO. | : 8,395,772 B2 | Page 1 of 1 |
| APPLICATION NO. | : 12/818358 | |
| DATED | : March 12, 2013 | |
| INVENTOR(S) | : Henricus Wilhelmus Maria Van Buel et al. | |

It is certified that error appears in the above-identified patent and that said Letters Patent is hereby corrected as shown below:

On title page, item (75) Inventors, Line 4
  replace "Deume (NL)"
  with --Deurne (NL)--.

Signed and Sealed this
Fourteenth Day of May, 2013

Teresa Stanek Rea
*Acting Director of the United States Patent and Trademark Office*